United States Patent [19]

Johnson

[11] 3,753,054

[45] Aug. 14, 1973

[54] HERMETICALLY SEALED ELECTRONIC PACKAGE

[75] Inventor: Clair Allen Johnson, Sherman, Tex.

[73] Assignee: Texas Instruments Incorporated, Dallas, Tex.

[22] Filed: Oct. 13, 1971

[21] Appl. No.: 188,445

Related U.S. Application Data

[62] Division of Ser. No. 67, Jan. 2, 1970, Pat. No. 3,657,805.

[52] U.S. Cl. ...... 317/234 R, 317/234 G, 317/234 H, 317/234 A, 174/52 S, 174/DIG. 3

[51] Int. Cl. ............................ H01l 3/00, H01l 5/00

[58] Field of Search .................... 317/234, 1, 4, 4.1; 174/52 S, DIG. 3

[56] References Cited

UNITED STATES PATENTS

| | | | |
|---|---|---|---|
| 3,303,265 | 2/1967 | Noren et al. | 317/234 G |
| 3,331,125 | 7/1967 | McCusker | 317/234 G |
| 3,337,678 | 8/1967 | Steimak | 317/234 G |
| 3,374,537 | 3/1968 | Doelp | 317/234 G |
| 3,435,516 | 4/1969 | Kilby | 317/234 G |
| 3,619,734 | 11/1971 | Assour | 317/234 N |
| 3,509,430 | 4/1970 | Mroz | 317/234 |
| 3,538,597 | 11/1970 | Leinkram et al. | 317/234 |
| 3,190,952 | 6/1965 | Bitko | 317/234 G |

*Primary Examiner*—John W. Huckert
*Assistant Examiner*—Andrew J. James
*Attorney*—Michael A. Sileo, Jr.

[57] ABSTRACT

In a method of housing semiconductors, a sealing collar formed from a nickel-cobalt-iron alloy is mounted on a ceramic boat. An LSI slice is then mounted on the boat within the collar. Finally, a lid formed from the material of the collar is welded to the distal end of the collar. In a second embodiment of the method, the boat is formed from a ceramic ring, a nickel-cobalt-iron alloy plate and a molybdenum plate. In a third embodiment, an LSI slice and at least one conventional integrated circuit are mounted on the boat within the collar.

10 Claims, 14 Drawing Figures

HERMETICALLY SEALED ELECTRONIC PACKAGE

This application is a division of application Ser. No. 000,067, filed Jan. 2, 1970, now U.S. Pat. No. 3,657,805 issued Apr. 25, 1972.

In the past, integrated circuits have comprised discrete units. Typically, a plurality of identical integrated circuits are fabricated simultaneously in the form of a relatively large slice. During the latter stages of such an operation, the individual integrated circuits of the slice are separated from each other and are thereafter individually mounted in suitable housings.

More recently, the concept of large scale integration (LSI) has been proposed. In accordance with the LSI concept, many of the various integrated circuits and other components comprising an electronic system are formed on a single slice. Preferably, extra or spare components are also provided so that in the event one of the components of the system is or becomes defective, a similar component can be substituted.

In the use of the LSI system the various components of the slice are not separated from one another. Thus, it is necessary to provide a housing for the entire LSI slice. Such a housing must satisfy at least two requirements. First, it must form a hermetic seal around the slice. Second, it must permit access to the slice so that the system on the slice can be repaired, if necessary.

This invention relates to a method of housing semiconductors tht meets both of these requirements. In accordance with the preferred embodiment of the invention, a semiconductor device is mounted on a device receiving member within a sealing member and a lid is joined to the sealing member. If access to the device is required, the joint between the lid and the sealing member is removed.

A more complete understanding of the invention may be had by referring to the following detailed description when taken in conjunction with the drawings, wherein.

Figure 5:
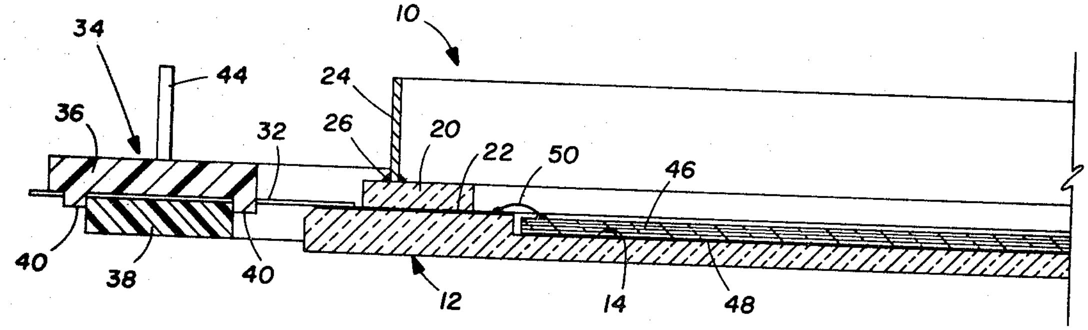
Figure 6:
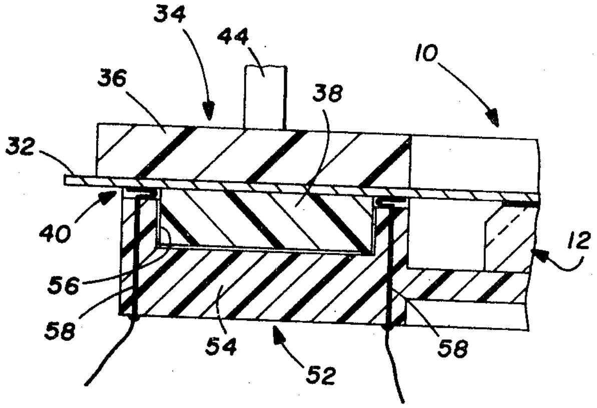
Figure 7:
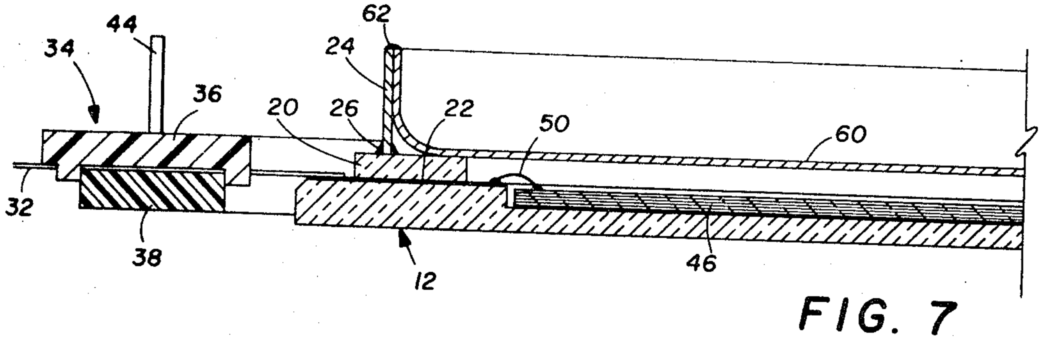
Figure 13:
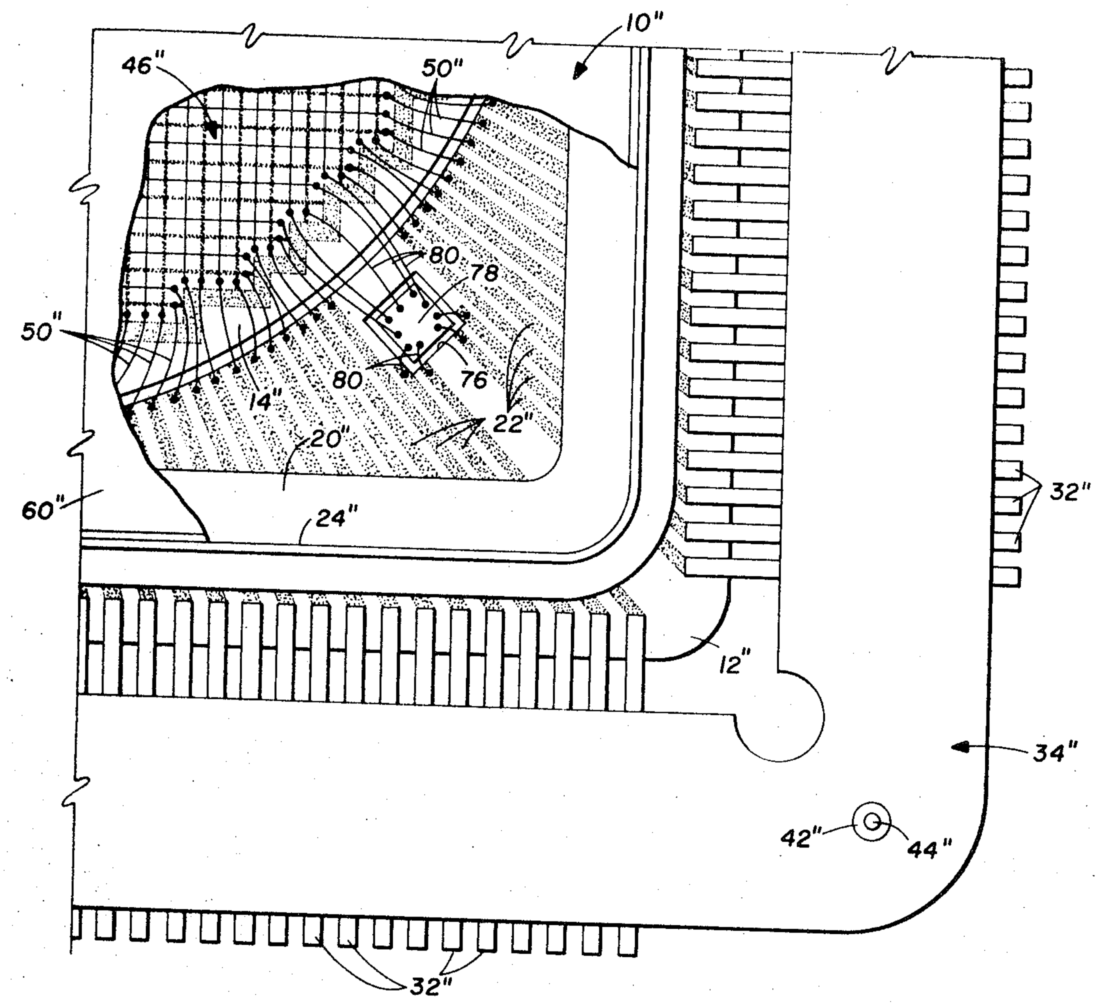

FIGS. 5, 6, and 7 are illustrations of intermediate steps in the first embodiment of the method;

FIGS. 8, 9, 10, 11 and 12 are illustrations of modified versions of the step down in FIG. 7;

FIG. 13 is an illustration of a third embodiment of the method, and

Figure 14:
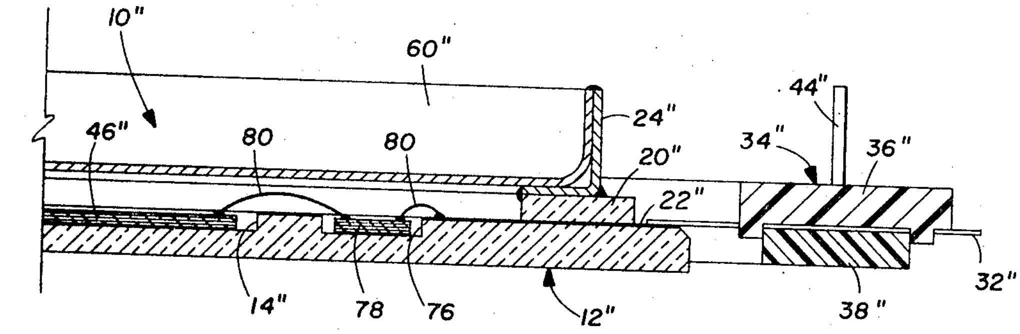

FIG. 14 is the sectional view taken generally along the line 14—14 in FIG. 13.

Figure 1:
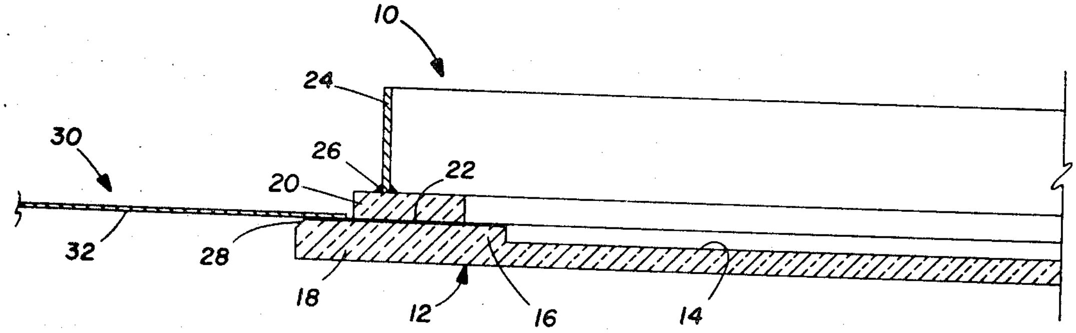
FIG. 1 is an illustration of an initial step in the first embodiment of a method of housing semiconductors employing the invention.

Referring now to FIG. 1, an initial step in a first embodiment of a method of housing semiconductors employing the invention is shwon. In accordance with the first embodiment, an LSI slice receiving member 10 includes a boat 12 formed from a high aluminum ceramic or a beryllia ceramic. The boat 12 includes a central slice receiving cavity 14, an inner lip 16 that extends around the cavity 14 and an outer lip 18 that extends around the outer periphery of the boat. A sealing rim 20 extends around the cavity 14 of the boat 12 between the inner lip 16 and the outer lip 18.

The boat 12 has outside dimensions of 2¼ × 2¼ × ⅛ inches and is preferably formed from separate pieces that are fused into an unitary structure. Prior to the fusing operation, a plurality of electrically conductive connector strips 22 are formed on one of the pieces. In the finished boat 12, the strips 22 extend from the upper surface of the inner lip 16 under the rim 20 to the upper surface of the outer lip 18.

The LSI receiving member 10 further includes a sealing collar 24 that extends around the slice receiving cavity 14 of the boat 12. The collar 24 is attached to the upper surface of the sealing rim 20 ofthe boat 12 by a malleable braze joint 26 and is preferably formed from a material having thermal expansion characteristics that match those of the material of the boat 12. For example, the collar 24 may be formed from an alloy containing 29 percent nickel, 17 percent cobalt and 54 percent iron. Such a material is sold under the trademark "KOVAR." Alternatively, the collar 24 may be formed from a malleable material, such as copper, or the like.

During the fabrication of the ceramic boat 12 of the LSI slice receiving member 10, the connector strips 22 are interconnected by a conductive strip that extends along the outer edge of the outer lip 18 of the boat 12. By means of such a strip, a brazing material is simultaneously electro-plated to at least the outer portions of all the strips 22 of the boat 12. Thereafter, the connector strips 22 are electrically disconnected from one to another, preferably by forming a beveled surface 28 along the outer edge of the outer lip 18 of the boat 12 and thereby removing the conductive strip extending between the connector strips 22.

After the strips 22 have been electrically disconnected, at least one lead frame 30 is attached to the LSI slice receiving member 10. The lead frame 30 includes a plurality of individual leads or pins 32 that are electrically interconnected at their distal ends. Each lead 32 is connected to one of the connector strips 22 of the boat 12 by positioning the lead 32 in engagement with its respective strip 22 and thereafter melting the brazing material on the strip 22. When all of the pins 32 are attached to the strips 22, the electrical interconnections between the pins 32 are employed to simultaneously electro-plate successive layers of nickel and gold over the exposed portions of all of the pins 32 and all of the strips 22.

Figure 3:
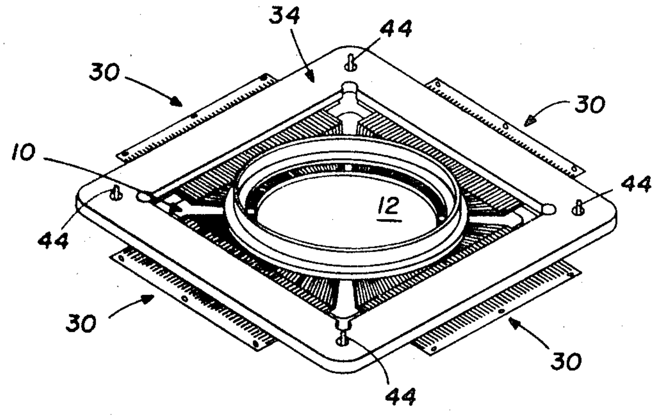
FIG. 3 is a perspective view of a carrier assembly useful in the practice of the invention.
Figure 4:
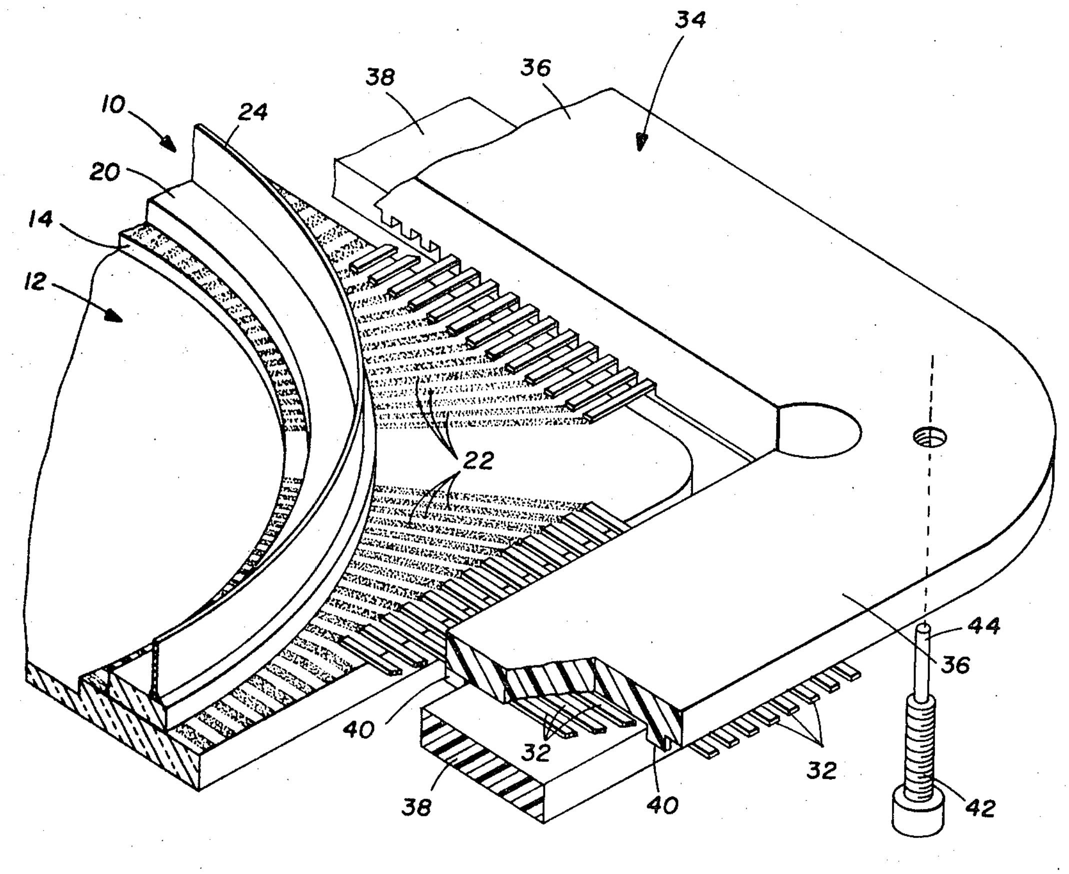
FIG. 4 is an enlarged prespective view similar to FIG. 3 in which certain parts have been broken away.

Referring now to FIG. 3, the LSI slice receiving member 10 is mounted in a carrier assembly 34 at the conclusion of the electro-plating operation. As is best shown in FIG. 4, the carrier assembly 34 includes an upper member 36 and a lower member 38. A plurality of teeth 40 extend downwardly from the upper member 36 and are positioned along inner and outer rows. The lower member 38 is positioned between the rows of teeth 40 and is clamped to the upper member 36 by a plurality of socket head screws 42 each having an upwardly extending projection 44. Thus, when the LSI slice receiving member 10 is in the carrier assembly 34, each pin or lead 32 of the member 10 is clamped between the upper and lower members 36 and 38 of the assembly 34 and is positioned between two pairs of the teeth 40 of the upper member 36.

After the LSI slice receiving member 10 is positioned in the carrier assembly 34, the interconnections between the distal ends of the leads 32 of the lead frames 30 are removed. As best shown in FIG. 5, a LSI slice 46 is then positioned in the slice receiving cavity 14 of the boat 12 and is secured to the boat 12 by adhesive means 48 such as solder, epoxy, etc. Thereafter, the connector strips 22 of the LSI slice receiving member 10 are connected to terminals of the LSI slice 46 by individual gold wires 50. Preferably, the wires 50 are connected to the strips 22 and to the terminals of the slice 46 by one of the commonly employed chisel bonding or ball bonding techniques.

When the connector strips 22 of the boat 12 have been connected to their respective terminals on the slice 46, various tests are performed. For example, the LSI slice receiving member 10 is subjected to a vacuum test to determine whether any leaks exist either in the structure of the boat 12 or in the malleable braze joint 26. Also, as is best shown in FIG. 6, the LSI slice receiving member 10 is positioned in a test fixture 52, whereupon various electrical tests are performed on the slice 46.

The test fixture 52 includes a body 54 having a cavity 56 formed in it which receives the lower member 38 of the carrier assembly 34. A plurality of conductive pins 58 are mounted in the body 54 for engagement with the leads 32. The pins 58 are connected to the output of a computer controlled LSI slice testing apparatus (not shown) and serve to form electrical connections between the testing apparatus and the LSI slice 46. The test fixture further includes a heat sink (not shown) which engages the lower surface of the boat 12 of the LSI slice receiving member 10 and serves to remove heat from the slice 46.

At the conclusion of the various testing operations, the LSI slice receiving member 10 is sealed. The sealing step is illustrated in FIG. 7 and comprises positioning a sealing lid 60 over the slice receiving cavity 14 of the member 10 and thereafter forming a weld 62 between the outer edge of the lid 60 and the outer edge of the collar 24. The lid 60 has outside dimensions that are substantially equal to the inside dimensions of the collar 24 and is preferably formed from the same material as the collar 24.

The weld 62 is preferably formed by employing a plasma arc welder to melt the outer edges of the collar 24 and the lid 60. Alternatively, a welding rod may be employed to form the weld 62. The weld 62 can also be formed by directing a welding current between a pair of rollers mounted in engagement with the collar 24 and the lid 60, respectively. Finally, the weld 62 need not be a true weld and can be a brazed joint, etc.

During the sealing step, a dry atmosphere is maintained around the slice 46. Alternatively, the slice receiving cavity can be filled with an inert gas before the lid 60 is attached to the collar 24. Finally, the slice receiving member 10 can be filled with a pressurized gas such as helium. The latter procedure is helpful in testing the assembly for leaks.

Various modified versions of the sealing step shown in FIG. 7 are illustrated in FIGS. 8 through 12. The version shown in FIG. 8 differs from the version shown in FIG. 7 in that a sealing collar 24*a* having an L-sahped cross section is employed. The version shown in FIG. 9 differs from the version shown in FIG. 8 in that a band of brazing material 64 is positioned between a collar 24*b* and the lid 60. In the use of the version shown in FIG. 9, a weld is formed by surrounding the collar 24*b* with an induction heating coil and thereafter operating the coil to melt the band 64.

Figure 8:
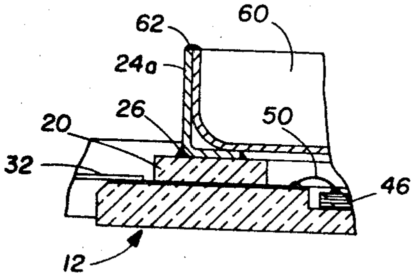
Figure 9:
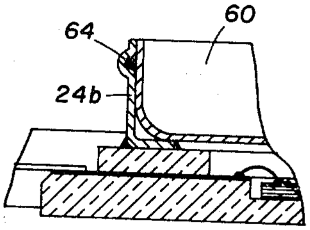
Figure 10:
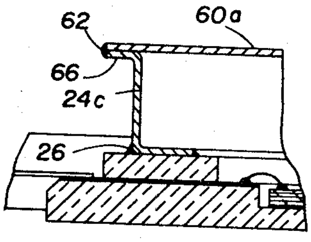
Figure 11:
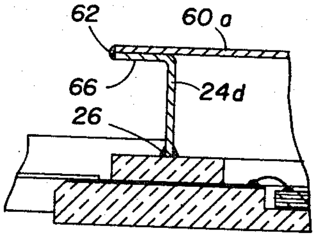
Figure 12:
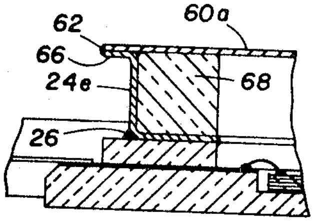

The versions of the sealing step shown in FIGS. 10, 11, 12 differ from the versions shown in FIGS. 7, 8, and 9 in that a flat lid 60*a* is employed In each case, the lid 60*a* is joined to an outwardly extending flange 66 formed on the distal end of a collar. In the version shown in FIG. 10, the lower portion of a collar 24*c* is shaped similarly to the lower portion of the collar 24*a* shown in FIG. 8, whereas in the version shown in FIG. 11, the lower portion of a collar 24*d* is shaped similarly to the lower portion of the collar 24 shown in FIG. 7. The version shown in FIG. 12 differs from the version shown in FIG. 10 principally in that a ring of ceramic material 68 is positioned between a collar 24*e* and a lid 60*a* to provide additional strength.

At the conclusion of the sealing step, the method of housing semiconductors according to the present invention is complete. The finished LSI assembly has the general appearance of the LSI slice receiving member 10 shown in FIG. 3. Of course, the slice receiving cavity 14 of the member 10 is covered by a lid 60 and the interconnecting portions of the lead frames 30 are removed.

The finished LSI assembly is subjected to a variety of tests including mechanical and thermal shock tests, bake out and thermal cycling tests, centrifuge tests, etc. Finally the LSI assembly is put into use. During the testing and the use of the LSI assembly, the carrier assembly remains attached to the leads extending from the boat. The carrier assembly protects the assembly and may be provided with identification means, if desired.

In the finished LSI assembly, the slice receiving member forms a hermetically sealed housing around the LSI slice. Because the collar and the lid of the slice receiving member are formed from a material having a coefficient of thermal expansion matched to that of the slice receiving boat and because the collar and the boat are interconnected by a malleable joint, the housing withstands wide variations in temperature without developing leaks. If access to the slice is ever required, the housing can be opened by simply sanding away the weld between the collar and the lid.

Figure 2:
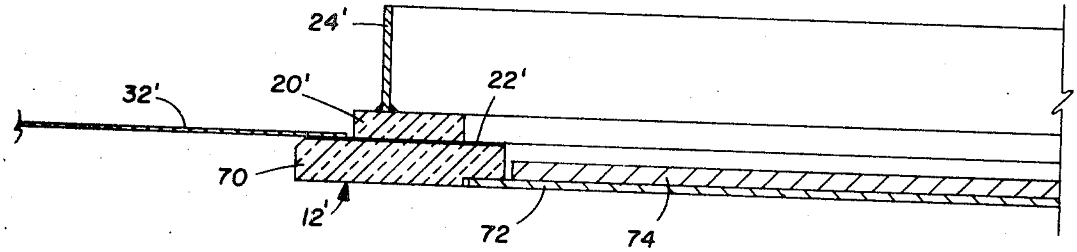
FIG. 2 is an llustration of a second embodiment of the method.

Referring now to FIG. 2, a second embodiment of the method of housing semiconductors employing the invention is shown. The second embodiment is identical to the first embodiment except that the boat 12′ of the second embodiment is comprised of three parts including a ring 70, a plate 72 and a plate 74. Preferably, tha boat 12 is fabricated by brazing the ring 70, the plate 72 and the plate 74 to one another.

In accordance with the second embodiment, the ring 70 is formed from a ceramic material. The plate 72 is formed from a material having thermal expansion characteristics similar to those of the ceramic material, for example, a nickel-cobalt-iron alloy may be employed. On the other hand, the plate 74 is formed from a material having thermal expansion characteristics that match those of the material of an LSI slice, for example, tungten or molybdenum.

When the boat 12′ is so constructed, thermal stresses imposed between the LSI slice and the plate 74 during the operation of the slice are minimized. Likewise, thermal stresses are minimized between the plate 72 and the ring 70. Since the thermal expansion characteristics of the plate 74 and the plate 72 are not matched, stresses are imposed between the components. However, since neither the plate 72 nor the plate 74 is an active component, and since the plates 72 and 74 are brazed together, such stresses produce substantially no deleterious effects.

A third embodiment of the method of housing semiconductors is illustrated in FIGS. 13 and 14. The third embodiment is virtually identical to the first embodiment in so far as the steps illustrated in FIGS. 1 and 3 through 12 are concerned. One difference between the third embodiment and the first embodiment is that the rim 20'', the collar 24'' and the lid 60'' of the third embodiment are square rather than round.

A very important difference between the third embodiment and the first embodiment is that a cavity 76 is formed in the boat 12'' of the LSI slice receiving member 10'' between the slice receiving cavity 14'' of the rim 20''. A conventional integrated circuit 78 is positioned in the cavity 76 and is connected to certain terminals on the LSI slice 46'' and to certain of the connector strips 22'' by a plurality of gold wires 80. Typically, the integrated circuit 76 is employed in the third embodiment to perform a function that cannot be performed by the various components of the LSI slice 46''. Therefore, the third embodiment of the method results in an LSI assembly that is virtually identical to the assembly resulting from the use of the first embodiment in so far as outward appearance is concerned, but which has greater utility in that it can perform at least one additional function.

The use of the method of housing semiconductors that is shown in the drawings and described herein results in several advantages over other housing methods. For example, in the practice of the various versions of the sealing step shown in FIGS. 7 through 12, the lid is joined to the collar by a weld. This is advantageous because it permits the use of multiple passes to assure the formation of a seal, if necessary. Also, a weld is easily removed to permit access to the slice.

It should be noted that in each case, the weld is formed along a line positioned a considerable distance from the slice. In and of itself, this protects the slice from damage due to heat. Also, the location of the weld permits the positioning of heat sink members between the outer edge of the collar and the slice while the weld is being formed.

The mounting of the slice receiving member in the carrier assembly also results in several advantages. For example, the carrier assembly protects and maintains the alignment of the leads of the assembly. The carrier assembly also positions both the LSI slice and the leads of the slice receiving member relative to test fixtures. By means of the projections of the socket head screws, the carrier assembly permits the stacking of LSI assemblies during shipping, storage, etc. Finally, each carrier assembly can be suitably tagged, whereupon automatic system can be employed to store and dispense LSI assemblies.

Although various embodiments of the invention are illustrated in the drawings and described herein, it will be understood tht the invention is not limited to the embodiments disclosed but is capable of rearrangement, modification and substitution of parts and elements without departing from the spirit of the invention.

What is claimed is:

1. A hermetically sealed electronic package comprising:

a slice receiving boat, said slice receiving boat being provided with a central cavity therein, an electronic device in the form of a slice mounted on said boat and being disposed wholly within the central cavity provided therein, said boat having a raised base portion bounding the central cavity provided therein and presenting a substantially planar top surface elevated above the bottom wall of the central cavity, a plurality of elongated electrically conductive connector strips disposed in spaced relation to each other, said plurality of spaced connector strips extending across the top surface of said base portion of said boat to present opposite ends terminating at the inner and outer peripheries of said base portion respectively, closure means fixedly mounted on the top surface of said base portion of said boat intermediate the inner and outer peripheries thereof and extending about the central cavity provided therein, said closure means overlying an intermediate portion of each of said plurality of said connector strips and covering said central cavity in said boat to enclose said slice within said boat in hermetically sealed relationship, a plurality of interconnecting electrical conductors extending between said slice and the inner ends of said plurality of connector strips on the top surface of said base portion of said boat and respectively connected thereto, and the outer ends of said plurality of connector strips being exposed outwardly of said closure means and the hermetically sealed slice on the outer periphery of said base portion of said boat fully supported by the top surface of said base portion.

2. A hermetically sealed electronic package as set forth in claim 1, wherein said closure means comprises:

an endless rim fixedly secured to the top surface of said base portion of said boat intermediate the inner and outer peripheries thereof and extending about the central cavity provided therein, said endless rim overlying an intermediate portion of each of said plurality of connector strips, an upstanding endless sealing collar fixedly secured to the upper surface of said endless rim and projecting upwardly therefrom, and a sealing lid fixedly secured to a portion of said collar remote from said boat and enclosing said slice within said boat in hermetically sealed relationship.

3. A hermetically sealed electronic package as set forth in claim 2, wherein said collar is secured to the upper surface of said endless rim by a malleable braze joint, said lid is seucred to said collar by a weld.

4. A hermetically sealed electronic package as set forth in claim 2, wherein said boat, said endless rim, said collar and said lid are made of materials having matched thermal expansion characteristics.

5. A hermetically sealed electronic package as set forth in claim 1, wherein said boat comprises:

a first plate defining the bottom wall of the central cavity and on which said slice is disposed, said first plate having thermal expansion characteristics similar to those of said slice, an outer endless member extending about said first plate and defining said raised base portion, said outer endless member having thermal expanson characteristics similar to those of said closure means, and a second plate disposed beneath said first plate and secured thereto in supporting engagement therewith, said second plate being further secured along its outer margin to said outer endless member and having thermal expansion characteristics similar to those of said outer endless member.

6. A hermetically sealed electronic package as set forth in claim 1, further including an integrated circuit chip mounted within said closure means on the top surface of said base portion at the inner periphery thereof, and a plurality of interconnecting electrical conductors extending from said integrated circuit chip to said slice and selected ones of said connector strips respectively and interconnecting said integrated circuit chip therebetween.

7. A hermetically sealed electronic package as set forth in claim 1, further including a plurality of electrical leads disposed externally of said boat and being respectively electrically connected to the exposed outer ends of said plurality of connector strips, and a segmental carrier assembly including upper and lower carrier members disposed externally of said boat, said upper and lower carrier members being positioned on opposite sides of said plurality of electrical leads, and means clamping said upper and lower carrier members in place on opposite sides of said electrical leads.

8. A hermetically sealed electronic package as set forth in claim 2, wherein said lid includes:

a substantially flat central portion covering the central cavity and the slice disposed therein and overlying an inner marginal portion of said endless rim, and an upstanding endless marginal flange integral with said flat central portion and disposed inwardly of and in frictional engagement with said collar; and a weld between said collar and said upstanding marginal flange of said lid hermetically sealing said slice within said boat.

9. A hermetically sealed electronic package as set forth in claim 8, wherein said weld is located between the upper edges of said collar and said upstanding marginal flange of said lid.

10. A hermetically sealed electronic package as set forth in claim 8, wherein said collar is provided with an endless outwardly projecting bead thereon cooperating with said upstanding marginal flange of said lid to define an endless channel in which a band of meltable weld material is initially disposed such that said weld is located in said channel.

* * * * *